United States Patent
Yang et al.

(10) Patent No.: US 7,821,292 B2
(45) Date of Patent: Oct. 26, 2010

(54) IMPEDANCE CALIBRATION PERIOD SETTING CIRCUIT AND SEMICONDUCTOR INTEGRATED CIRCUIT

(75) Inventors: Ji Yeon Yang, Gyeonggi-go (KR); Dong Uk Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/493,438

(22) Filed: Jun. 29, 2009

(65) Prior Publication Data

US 2010/0156455 A1   Jun. 24, 2010

(30) Foreign Application Priority Data

Dec. 23, 2008   (KR) ...................... 10-2008-0131968

(51) Int. Cl.
 *H03K 17/16* (2006.01)
 *H03K 19/003* (2006.01)
(52) U.S. Cl. .......................................... 326/30; 326/32
(58) Field of Classification Search ............. 326/30–32; 365/189.05, 189.06, 189.09
See application file for complete search history.

(56) References Cited

U.S. PATENT DOCUMENTS

| | | | |
|---|---|---|---|
| 5,651,127 A * | 7/1997 | Gove et al. ................... 711/202 |
| 5,717,654 A * | 2/1998 | Manning .................. 365/233.5 |
| 5,737,748 A * | 4/1998 | Shigeeda .................... 711/122 |
| 5,802,555 A * | 9/1998 | Shigeeda .................... 711/106 |
| 5,831,467 A * | 11/1998 | Leung et al. ................. 327/319 |
| 6,122,214 A * | 9/2000 | Fujimoto et al. ............. 365/222 |
| 6,240,035 B1 * | 5/2001 | Noda et al. .................. 365/226 |
| 6,246,619 B1 * | 6/2001 | Ematrudo et al. ........... 365/201 |
| 6,310,814 B1 * | 10/2001 | Hampel et al. .............. 365/222 |
| 6,424,586 B1 * | 7/2002 | Noda et al. .................. 365/227 |
| 6,498,762 B2 * | 12/2002 | Noda et al. .................. 365/227 |
| 7,019,553 B2 * | 3/2006 | Blodgett et al. ............... 326/30 |
| 7,138,823 B2 * | 11/2006 | Janzen et al. .................. 326/30 |
| 7,227,376 B2 * | 6/2007 | Ahmad et al. ................. 326/30 |
| 7,285,979 B2 * | 10/2007 | Janzen et al. .................. 326/30 |
| 7,439,762 B2 * | 10/2008 | Lee ............................. 326/30 |
| 7,459,930 B2 * | 12/2008 | Mei ............................. 326/30 |
| 7,463,052 B2 * | 12/2008 | Blodgett et al. ............... 326/30 |
| 7,471,585 B2 * | 12/2008 | Shinozaki et al. ........... 365/222 |
| 7,477,083 B2 | 1/2009 | Fujisawa et al. |
| 7,528,626 B2 | 5/2009 | Kim |
| 7,633,310 B2 * | 12/2009 | Fukushi ....................... 326/30 |
| 7,672,184 B2 * | 3/2010 | Im et al. ..................... 365/222 |
| 2002/0031030 A1 * | 3/2002 | Choi et al. .................. 365/222 |

(Continued)

FOREIGN PATENT DOCUMENTS

JP   2007-116574 A   5/2007

(Continued)

*Primary Examiner*—James H. Cho
*Assistant Examiner*—Matthew C Tabler
(74) *Attorney, Agent, or Firm*—Ladas & Parry LLP (57) ABSTRACT

An impedance calibration period setting circuit includes a command decoder and an impedance calibration activation signal generator. The command decoder combines external signals to generate a refresh signal. The impedance calibration activation signal generator is configured to generate an impedance calibration activation signal in response to the refresh signal and an address signal. The impedance calibration period setting circuit prevents abnormal changes in an impedance calibration code and reduces current consumption.

20 Claims, 6 Drawing Sheets

U.S. PATENT DOCUMENTS

| | | | |
|---|---|---|---|
| 2002/0060944 A1* | 5/2002 | Noda et al. | 365/227 |
| 2002/0163845 A1* | 11/2002 | Ooishi et al. | 365/222 |
| 2003/0128599 A1* | 7/2003 | Martin | 365/198 |
| 2005/0146968 A1* | 7/2005 | Shinozaki et al. | 365/222 |
| 2006/0109722 A1* | 5/2006 | Martin | 365/198 |
| 2006/0125516 A1* | 6/2006 | Blodgett et al. | 326/30 |
| 2006/0285413 A1* | 12/2006 | Shinozaki et al. | 365/222 |
| 2007/0070727 A1* | 3/2007 | Do et al. | 365/191 |
| 2007/0132493 A1 | 6/2007 | Fujisawa et al. | |
| 2007/0148796 A1* | 6/2007 | Nakamura et al. | 438/17 |
| 2007/0174575 A1* | 7/2007 | Lovett | 711/167 |
| 2007/0195627 A1* | 8/2007 | Kim | 365/222 |
| 2008/0112246 A1* | 5/2008 | Mei | 365/210.1 |
| 2008/0137464 A1* | 6/2008 | Kim | 365/222 |
| 2008/0211534 A1 | 9/2008 | Jeong et al. | |
| 2008/0219068 A1 | 9/2008 | Kim et al. | |
| 2008/0266933 A1* | 10/2008 | Chen et al. | 365/148 |
| 2008/0304336 A1 | 12/2008 | Kim et al. | |
| 2009/0256587 A1* | 10/2009 | Kuboyama et al. | 326/30 |
| 2009/0284281 A1* | 11/2009 | Oh et al. | 326/30 |
| 2010/0001758 A1* | 1/2010 | Dreps et al. | 326/30 |
| 2010/0088483 A1* | 4/2010 | Lovett | 711/167 |
| 2010/0097868 A1* | 4/2010 | Merritt et al. | 365/193 |

FOREIGN PATENT DOCUMENTS

| | | |
|---|---|---|
| JP | 2007-123987 A | 5/2007 |
| JP | 2008-219865 A | 9/2008 |
| JP | 2008-228276 A | 9/2008 |
| KR | 1020070044790 A | 4/2007 |
| KR | 1020070102074 A | 10/2007 |

* cited by examiner

IMPEDANCE CALIBRATION PERIOD SETTING CIRCUIT AND SEMICONDUCTOR INTEGRATED CIRCUIT

CROSS-REFERENCES TO RELATED PATENT APPLICATION

The present application claims priority under 35 U.S.C 119(a) to Korean Application No. 10-2008-0131968, filed on Dec. 23, 2008, in the Korean Intellectual Property Office, which is incorporated herein by reference in its entirety as set forth in full.

BACKGROUND

1. Technical Field

Embodiments described herein relate generally to semiconductor circuit technology, and more particularly, to an impedance calibration period setting circuit and semiconductor integrated circuit.

2. Background

To achieve uniform input and output characteristics irrespective of fluctuations in environmental conditions, such as process/voltage/temperature (PVT), a semiconductor integrated circuit uses an on die termination function allowing the device to maintain a target value of the impedance of a data driver and the impedance of an input and output pad 'DQ'.

The on die termination function uses a code signal (hereinafter, impedance calibration code) generated by an operation generally called 'ZQ' calibration. The 'ZQ' calibration operation is an impedance calibration operation that matches an external resistor connected through an external resistor connecting pad 'ZQ' of the semiconductor integrated circuit with a resistance value of a duplicate data driver circuit.

More specifically, the data driver and the on die termination block, which are connected to the input and output pad 'DQ', are designed so as to be capable of calibrating their respective impedances according to the code signal, and the impedance calibration code is input to the data driver and the on die termination block to perform the on die termination function.

Figure 1:
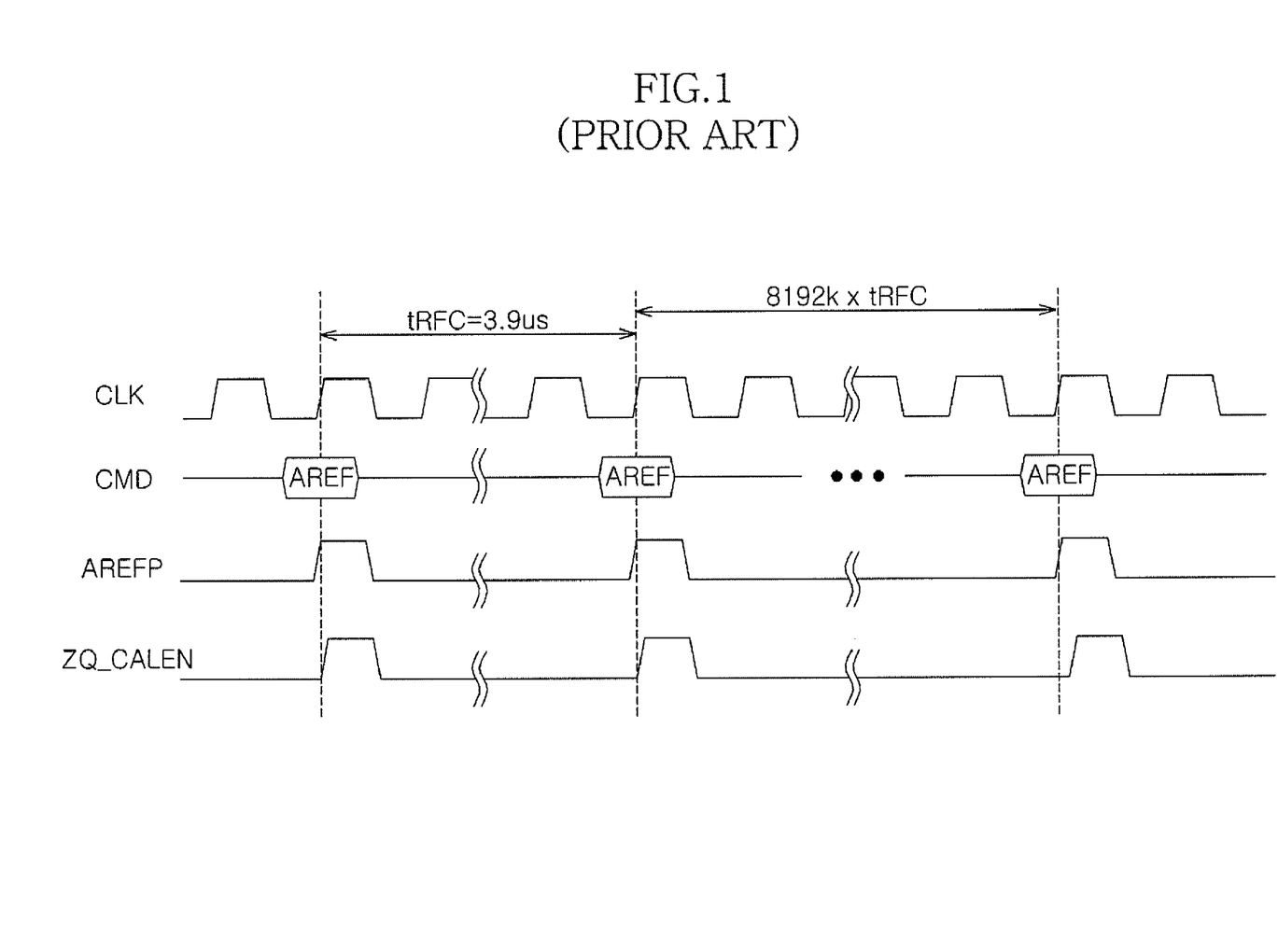
FIG. 1 is a timing diagram showing the impedance calibration period of a typical device.

Referring to FIG. 1, a typical semiconductor integrated circuit performs an impedance calibration operation every time a refresh, in particular, an external refresh command such as an auto refresh command 'AREF' commanded by a memory controller is generated in order to conserve written data.

In more detail, the impedance calibration operation, which is performed every time the auto refresh command 'AREF' is input, is carried out based upon a recognition that an auto refresh command 'AREF' is generated upon the passage of a standard time 'tRFC=3.9 µs', which defines the input period of the refresh command. An activation signal 'ZQ_CALEN' for starting the impedance calibration operation is therefore activated according to the internally generated refresh signals 'AREFP' occur.

The main object of the foregoing impedance calibration operation is to compensate for the change in the input and output characteristics due to fluctuations in temperature among process/voltage/temperature (PVT).

The impedance calibration operation illustrated in FIG. 1 is periodically performed every time the auto refresh command 'AREF' is generated, that is, at a standard time interval 'tRFC=3.9 µs', as described above. As a consequence, the impedance calibration operation the period between which the impedance calibration operation can be too short, since the impedance calibration operation is performed regardless of the minimum amount of time needed to reflect changes in temperature, for which compensation is necessary.

Therefore, there are problems in that a semiconductor integrated circuit operating as illustrated in FIG. 1 increases the probability of an abnormal fluctuation of the impedance calibration code due to the frequent impedance calibration operation and further the frequent operation increases current consumption of the semiconductor integrated circuit.

SUMMARY

An impedance calibration period setting circuit and a semiconductor integrated circuit capable of performing a stable impedance calibration operation and reducing current consumption are described herein.

An impedance calibration period setting circuit according to an embodiment is configured to include: a command decoder that combines external signals to generate a refresh signal; and an impedance calibration activation signal generator configured to generate an impedance calibration activation signal in response to the refresh signal and an address signal.

A semiconductor integrated circuit according to an embodiment is configured to include: a command decoder that decodes a combination of a plurality of external signals to generate a refresh signal; an address counter configured to count an internal address signal according to the refresh signal; an impedance calibration activation signal generator configured to generate an impedance calibration activation signal in response to the internal address signal and the refresh signal; an impedance calibration code generator configured to generate impedance calibration codes in response to the activation of the impedance calibration activation signal; and an input and output circuit unit configured to perform data input and output by impedance set according to the impedance calibration code.

The impedance calibration period setting circuit and the semiconductor integrated circuit according to an embodiment can adjust the impedance calibration period to a desired value to stably calibrate the impedance and reduce current consumption, thereby making it possible to improve the operational characteristics of a semiconductor integrated circuit.

These and other features, aspects, and embodiments are described below in the period "Detailed Description."

BRIEF DESCRIPTION OF THE DRAWINGS

Features, aspects, and embodiments are described in conjunction with the attached drawings, in which.

DETAILED DESCRIPTION

Hereinafter, an exemplary impedance calibration period setting circuit and a semiconductor integrated circuit according to an embodiment of the present invention will be described with reference to the accompanying drawings.

Figure 2:
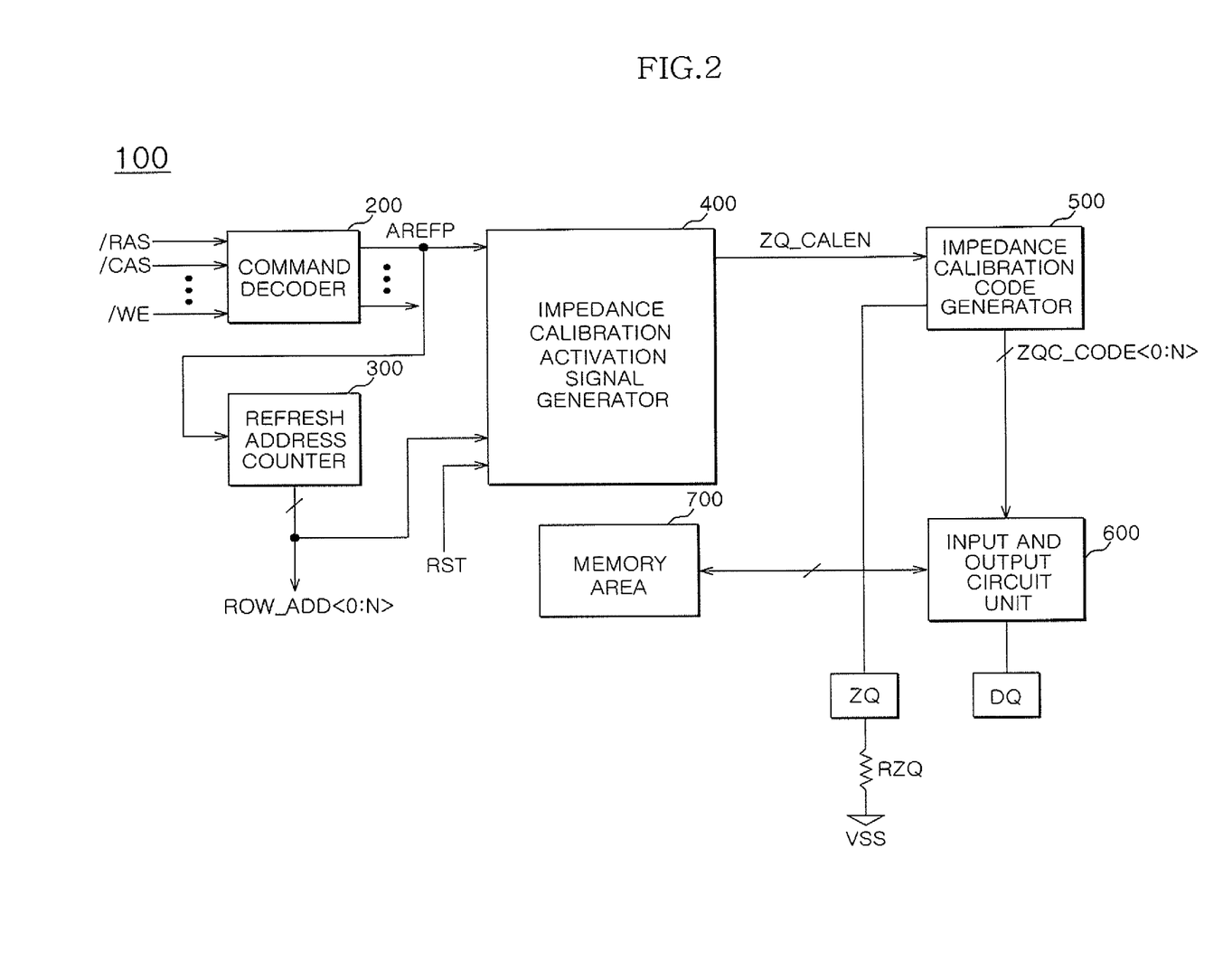
FIG. 2 is a configuration diagram showing a semiconductor integrated circuit according to an embodiment of the present invention.

FIG. 2 is a configuration diagram showing a semiconductor integrated circuit according to an embodiment of the present invention.

As shown in FIG. 2, the semiconductor integrated circuit 100 according to an embodiment includes a command decoder 200, a refresh address counter 300, an impedance calibration activation signal generator 400, an impedance calibration code generator 500, an input and output circuit unit 600, and a memory area 700.

The command decoder 200 is configured to decode a combination of external signals '/RAS, /CAS, /WE . . . ' (the external signals are not limited only to these signals and may include additional external signals or different combinations of these signals) and generate various operation command signals including an auto refresh signal 'AREFP' along with, for example, an active signal, a precharge signal, etc.

The refresh address counter 300 is configured to generate row address 'ROW_ADD<0:N>' according to the auto refresh signal "AREFP".

The impedance calibration activation signal generator 400 is configured to generate an impedance calibration activation signal 'ZQ_CALEN' by combining the auto refresh signal 'AREFP', which corresponds to an activation period of a row address signal 'ROW_ADD<i>' for period calibration, and a reset signal 'RST'. The row address signal 'ROW_ADD<i>' for period calibration selects a specific bit among the row address 'ROW_ADD<0:N>'.

The period of the impedance calibration activation signal 'ZQ_CALEN' can be adjusted according to the bit selected among the row address 'ROW_ADD<0:N>'.

In other words, in an embodiment the impedance calibration activation signal generator 400 can be configured in such a way so that when the most significant bit is selected among the row address 'ROW_ADD<0:N>', the period of the impedance calibration activation signal 'ZQ_CALEN' is the longest and when the least significant bit is selected among the row address 'ROW_ADD<0:N>' the period of the impedance calibration activation signal 'ZQ_CALEN' is the shortest. For example, when the most significant bit is selected among the row address 'ROW_ADD<0:N>' the period of the impedance calibration activation signal 'ZQ_CALEN' can be 8192k*tRFC and when a bit subsequent to the most significant bit is selected among the row address 'ROW_ADD<0:N>', the period of the impedance calibration activation signal 'ZQ_CALEN' can be 4096k*tRFC. In this manner, the period of the impedance calibration activation signal 'ZQ_CALEN' varies according to which bit among the row address is selected, and therefore the period of the impedance calibration activation signal 'ZQ_CALEN' can be adjusted.

The impedance calibration code generator 500 is configured to generate the impedance calibration code 'ZQC_CODE<0:N>' in response to an activated impedance calibration activation signal 'ZQ_CALEN'. The impedance calibration code generator 500 is connected to an external resistor 'RZQ' through an external resistor connecting pad 'ZQ'.

The input and output circuit unit 600 is configured to perform data input and output between the input and output pad 'DQ' and the memory area 700 by impedance set according to the impedance calibration code 'ZQC_CODE<0:N>'.

The memory area 700 can include a plurality of memory cells and column/row control circuits for controlling data input and output.

Figure 3:
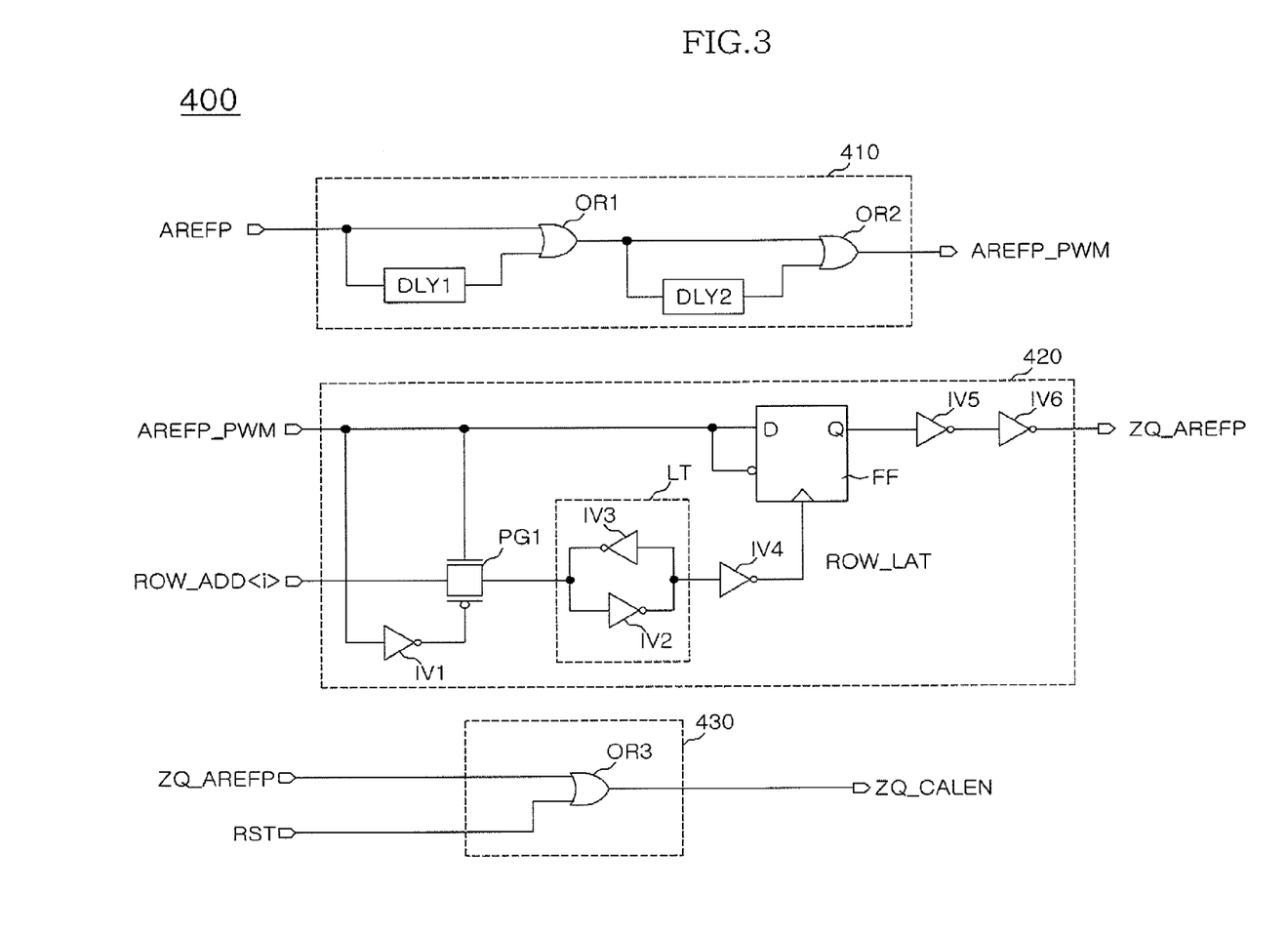
FIG. 3 is a configuration diagram showing an embodiment of the impedance calibration activation signal generator of FIG. 2.

FIG. 3 is a configuration diagram of the impedance calibration activation signal generator of FIG. 2.

As shown in FIG. 3, the impedance calibration activation signal generator 400 includes a pulse width calibrator 410, a period calibrator 420, and a signal generator 430.

In an embodiment, the pulse width calibrator 410 includes first and second delay devices 'DLY1 and DLY2' and first and second OR gates 'OR1 and OR2'. The pulse width calibrator 410 is configured to increase the pulse width of the auto refresh signal 'AREFP' by the delay time of the first and second delay devices 'DLY1 and DLY2' in order to generate a pulse width calibration signal 'AREFP_PWM'.

In an embodiment, the period calibrator 420 includes first to sixth inverters 'IV1 to IV6', a flip flop 'FF', a pass gate 'PG1' and a latch 'LT'. A latch 'LT' comprises the second and third inverters 'IV2 and IV3' connected in a latch configuration. In an embodiment of the present invention, the flip-flop FF may be a gated D-latch. The period calibrator 420 is configured to output a period calibration signal 'ZQ_AREFP' by latching the pulse width calibration signal 'AREFP_PWM' in response to the activation of the row address signal 'ROW_ADD<i>' for period calibration input according to the activation of the pulse width calibration signal 'AREFP_PWM'.

The pulse width calibration signal 'AREFP_PWM', which is a signal generated to have an increased pulse width as compared to the auto refresh signal 'AREFP', is a signal used for stably securing a latch timing margin of the pulse width calibration signal 'AREFP_PWM' by the row address signal 'ROW_ADD<i>' for period calibration. Therefore, if a sufficient timing margin can be achieved by directly using the auto refresh signal 'AREFP' instead of the pulse width calibration signal 'AREFP_PWM'; the pulse width calibrator 410 is not is needed and can thus be cancelled.

The signal generator 430 includes an OR gate 'OR3' and is configured to generate the impedance calibration activation signal 'ZQ_CALEN' by performing an OR logical operation on the period calibration signal 'ZQ_AREFP' and the reset signal 'RST'.

Figure 4:
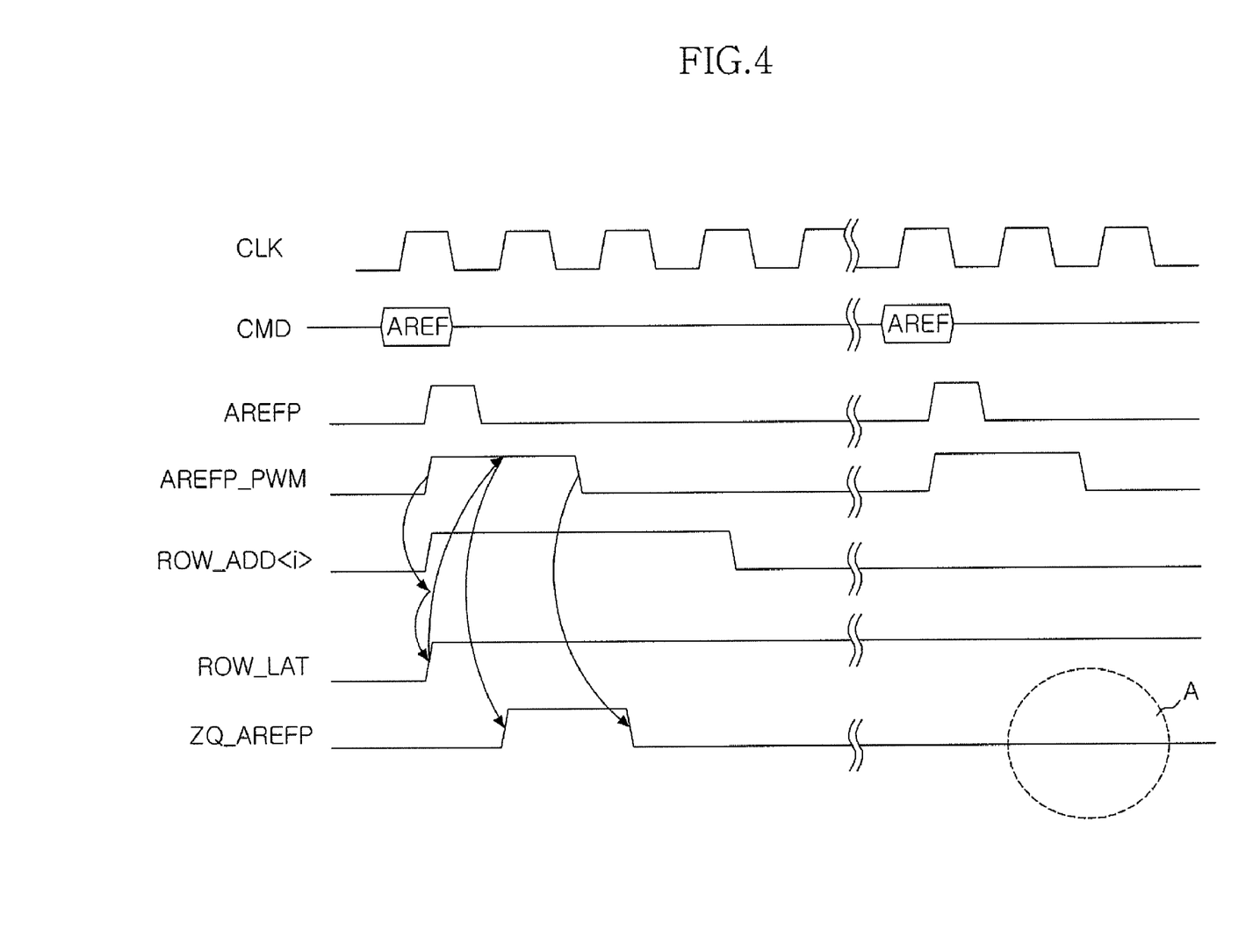
FIG. 4 is a timing diagram showing the operation of the impedance calibration activation signal generator of FIG. 3.

FIG. 4 is a timing diagram shown for illustrating the operation of the impedance calibration activation signal generator of FIG. 3.

Referring to FIG. 4, the auto refresh signal 'AREFP' is generated according to the auto refresh command 'AREF'.

The pulse width calibration signal 'AREFP_PWM', which has an increased pulse width in comparison to the pulse width of the auto refresh signal 'AREFP', is generated in response to the auto refresh signal 'AREFP'.

When the row address signal for period calibration 'ROW_ADD<i>' is activated during the activation period of the pulse width calibration signal 'AREFP_PWM', the pass gate allows the row address signal for period calibration 'ROW_ADD<i> to pass in response to the activated pulse width calibration signal 'AREFP_PWM', and the row address signal for period calibration 'ROW_ADD<i> is latched by the latch LT. The flip flop 'FF' receives the pulse width calibration signal 'AREFP_PWM' as a data input in order to generate the period calibration signal 'ZQ_AREFP' by the latched signal 'ROW LAT' input to the enable input of the flip flop FF.

Conversely, when the row address signal for period calibration 'ROW_ADD<i>' is not activated during the activation period of the pulse width calibration signal 'AREFP_PWM' the flip flop 'FF' does not receive an activated signal via its enable input (i.e., the flip flop effectively disregards the activated pulse width calibration signal), such that the generation of the period calibration signal 'ZQ_AREFP' is prevented as illustrated by the oblique area 'A'.

Figure 5:
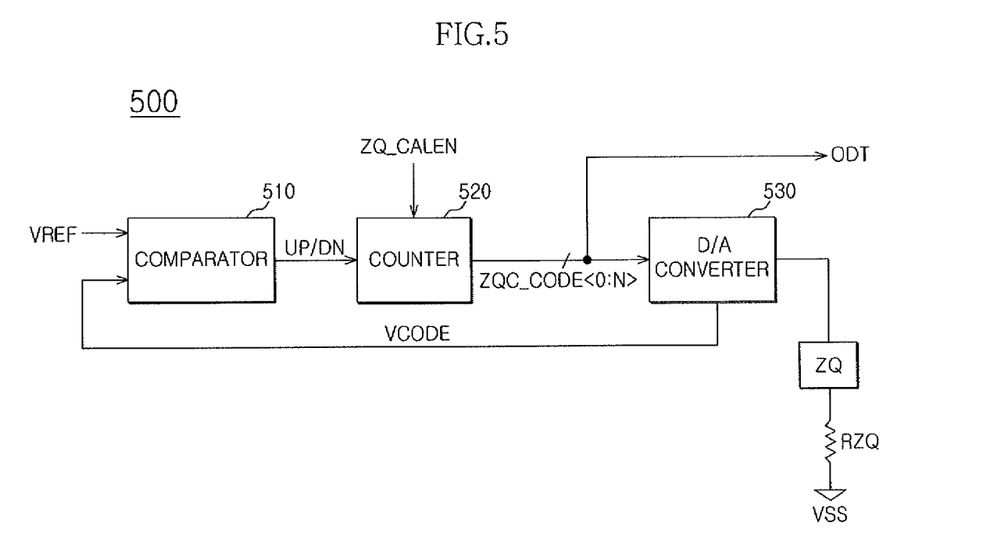
FIG. 5 is a configuration diagram showing an embodiment of the impedance calibration code generator of FIG. 2.

FIG. 5 is a configuration diagram of the impedance calibration code generator of FIG. 2.

As shown in FIG. 5, the impedance calibration code generator 500 includes a comparator 510, a counter 520, and a digital/analog (D/A) converter 530.

The comparator 510 is configured to output a comparing signal 'UP/DN' by comparing a reference voltage 'VERF' to a code conversion voltage 'VCODE'.

The counter 520 is configured to perform the up/down count of the impedance calibration code 'ZQC_CODE<0:N>' according to the comparing signal 'UP/DN' and the impedance calibration activation signal 'ZQ_CALEN'.

The D/A converter 530 is configured to convert the impedance calibration code 'ZQC_CODE<0:N>' into the code conversion voltage 'VCODE'. The D/A converter 530 includes a duplication circuit that duplicates a pull up leg and a pull down leg of a data driver, and the duplication circuit is connected to the external resistor 'RZQ' through the external resistor connecting pad 'ZQ'.

When the resistance value of the duplication circuit matches the resistance value of the external resistor 'RZQ', the impedance calibration code generator 500 is operated using a principle of matching the code conversion voltage 'VCODE' with the reference voltage 'VERF'. In other words, until the value of the code conversion voltage 'VCODE' and the value of the reference voltage 'VERF' approach each other and the difference between the two is within a predetermined acceptable error range, the final impedance calibration code 'ZQC_CODE<0:N>' is being determined by repeating a process of increasing or reducing the impedance calibration code 'ZQC_CODE<0:N>'. The finally determined impedance calibration code 'ZQC_CODE<0:N>', that is, the impedance calibration code when the difference becomes within the acceptable range, is provided to the input and output circuit unit 600.

Figure 6:
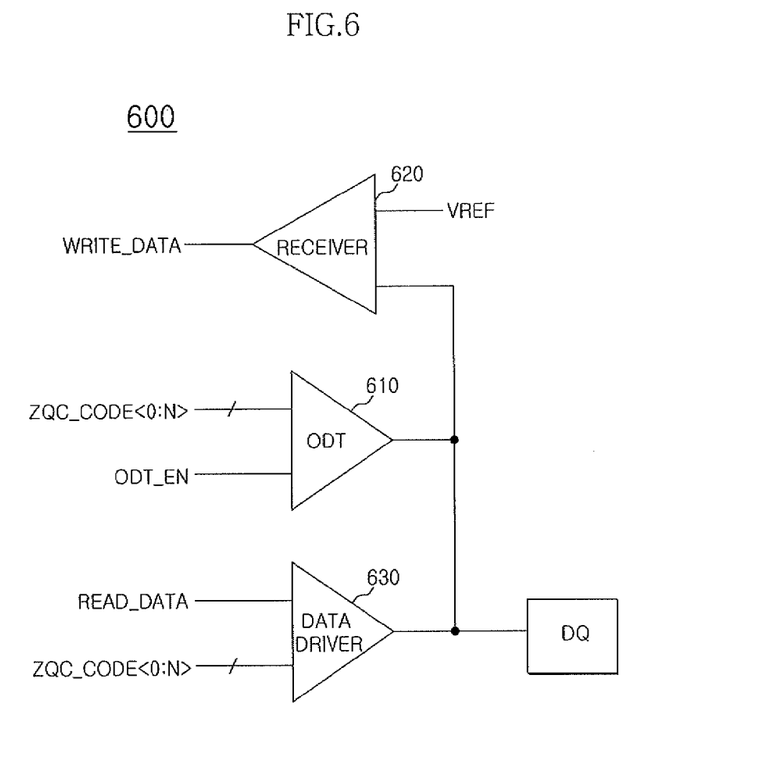
FIG. 6 is a configuration diagram showing an embodiment of the input and output circuit unit of FIG. 2.

FIG. 6 is a configuration diagram of the input and output circuit unit of the semiconductor integrated circuit shown FIG. 2 according to an embodiment of the present invention.

As shown in FIG. 6, the input and output circuit unit 600 includes an on die termination block 'ODT' 610, a receiver 620, and a data driver 630.

The on die termination block 610 is configured to perform a termination operation in which the impedance of the input and output pad 'DQ' is made to be a target value by the impedance set according to the impedance calibration code 'ZQC_CODE<0:N>'. The on die termination block 610 also includes the duplication circuit that duplicates the pull up leg and the pull down leg of the data driver, similar to the D/A converter 530 of the impedance calibration code generator 500.

The receiver 620 is configured to output write data 'WRITE_DATA' by comparing a signal input through the input and output pad 'DQ' to the reference voltage 'VERF'. The write data 'WRITE_DATA' is transmitted to the memory area 700 through a signal line.

The data driver 630 is configured to drive read data 'READ_OUT' transmitted from the memory area 700 by the impedance set according to the impedance calibration code 'ZQC_CODE<0:N>' and output the driven read data to the input and output pad 'DQ'.

Figure 7:
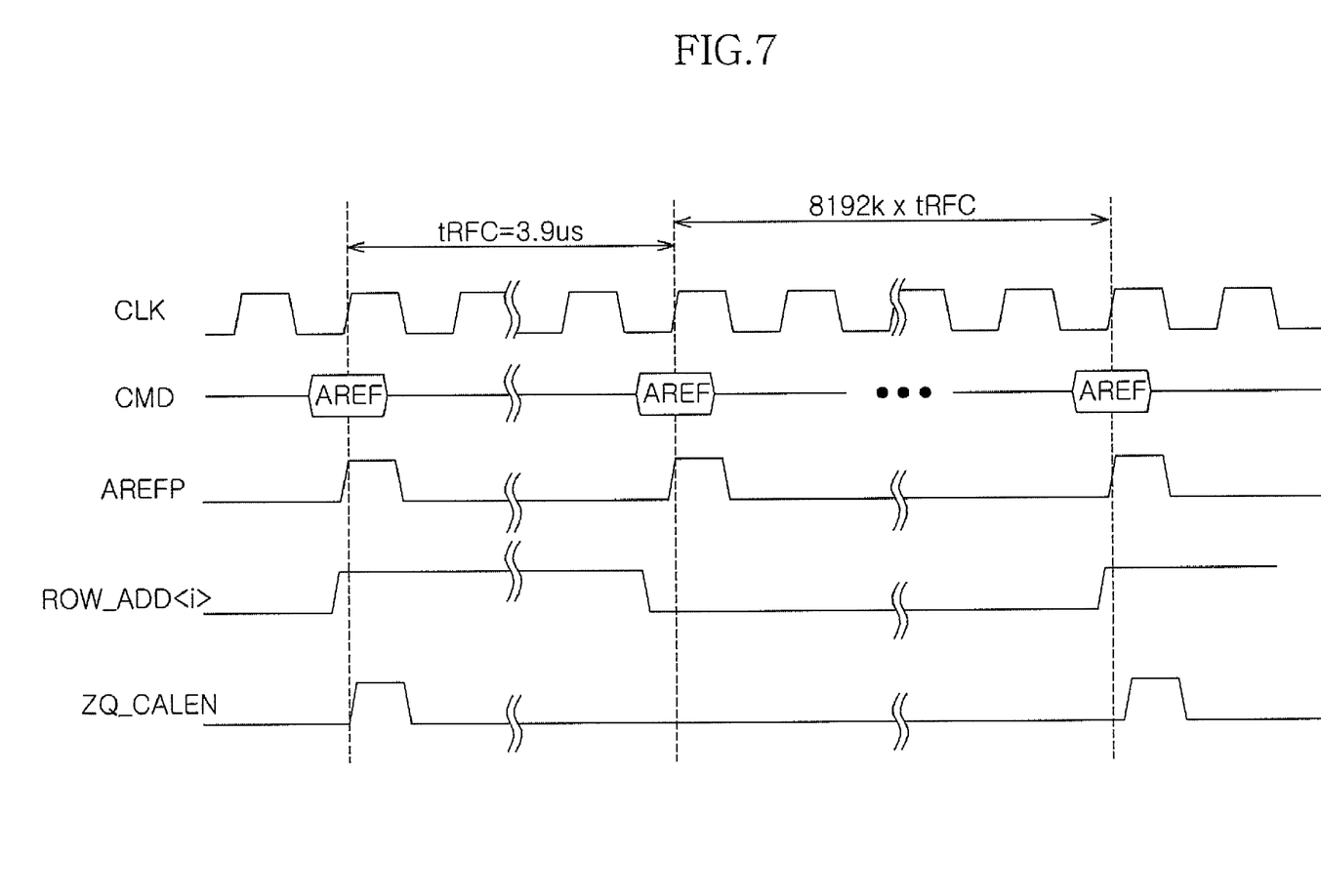
FIG. 7 is a timing chart showing the impedance calibration period according to an embodiment of the present invention.

FIG. 7 is a timing diagram showing the impedance calibration period according to an embodiment of the present invention.

As shown in FIG. 7, the embodiment generates the impedance calibration activation signal 'ZQ_CALEN' by using the auto refresh signal 'AREFP' only when the row address signal 'ROW_ADD<i>' for period calibration is activated.

For example, in the case in which the row address signal for period calibration 'ROW_ADD<i>' is selected to be the most significant bit among the row address 'ROW_ADD<0:N>', the row address signal 'ROW_ADD<i>' for period calibration 'ROW_ADD<i>' is generated according to the initial auto refresh signal 'AREFP' and will be generated for each 8192k*tRFC after tRFC elapses as illustrated in FIG. 7.

As a result, an embodiment of the present invention can calibrate the generation period of the impedance calibration activation signal 'ZQ_CALEN', and can thus generate the impedance calibration activation signal 'ZQ_CALEN' so as to have a longer period than that of the auto refresh signal 'AREFP'. Therefore, embodiments of the present invention can prevent abnormal changes in the impedance calibration code 'ZQC_CODE<0:N>', thus making it possible to stably perform the impedance calibration operation and significantly reduce current consumption.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. An impedance calibration period setting circuit comprising:
    a command decoder configured to combine external signals to generate a refresh signal; and
    an impedance calibration activation signal generator configured to generate an impedance calibration activation signal in response to the refresh signal and an address signal.

2. The impedance calibration period setting circuit according to claim 1, wherein the address signal is a row address signal generated to perform a refresh operation.

3. The impedance calibration period setting circuit according to is claim 2, wherein an activation period of the impedance calibration activation signal varies depending upon which one of a plurality of bits of the row address signal is provided to the impedance calibration activation signal generator, such that the activation period of the impedance calibration activation signal is calibrated according to the row address signal.

4. The impedance calibration period setting circuit according to claim 3, wherein the impedance calibration activation signal generator is configured to generate the impedance calibration activation signal by latching the refresh signal in response to activation of the row address signal.

5. The impedance calibration period setting circuit according to claim 1, wherein the impedance calibration activation signal generator comprises:
    a period calibrator configured to output a period calibration signal by latching the refresh signal in response to activation of the address signal, wherein the address signal is input in response to activation of the refresh signal; and a signal generator configured to generate the impedance calibration activation signal by combining the period calibration signal and a reset signal.

6. The impedance calibration period setting circuit according to claim 5, wherein the period calibrator comprises:
   a flip flop configured to receive the refresh signal through an input terminal; and
   a transmitting device configured to transmit the address signal to an enable input terminal of the flip flop in response to the activation of the refresh signal.

7. The impedance calibration period setting circuit according to claim 6, wherein the signal generator is configured to perform an OR logical combination on the period calibration signal and the reset signal.

8. The impedance calibration period setting circuit according to claim 7, wherein the impedance calibration activation signal generator further comprises a pulse width calibrator configured to adjust a pulse width of the refresh signal, wherein the adjusted pulse width is input to the period calibrator.

9. A semiconductor integrated circuit, comprising:
   a command decoder that decodes a combination of a plurality of external signals to generate a refresh signal;
   an address counter configured to generate an internal address signal in response to the refresh signal;
   an impedance calibration activation signal generator configured to generate an impedance calibration activation signal in response to the internal address signal and the refresh signal;
   an impedance calibration code generator configured to generate an impedance calibration code in response to an activation of the impedance calibration activation signal; and
   an input and output circuit unit configured to perform data input and output by an impedance set according to the impedance calibration code.

10. The semiconductor integrated circuit according to claim 9, wherein the internal address signal is a row address signal generated to perform a refresh operation.

11. The semiconductor integrated circuit according to claim 10, wherein an activation period of the impedance calibration activation signal varies depending upon which one of a plurality of bits of the row address signal is provided to the impedance calibration activation signal generator, such that the activation period of the impedance calibration activation signal is calibrated according to the row address signal.

12. The semiconductor integrated circuit according to claim 11, wherein the impedance calibration activation signal generator is configured to generate the impedance calibration activation signal by latching the refresh signal in response to activation of the internal address signal.

13. The semiconductor integrated circuit according to claim 9, wherein the impedance calibration activation signal generator comprises:
   a period calibrator configured to output a period calibration signal by latching the refresh signal in response to activation of the internal address signal, wherein the internal address signal is input in response to activation of the refresh signal; and
   a signal generator configured to generate the impedance calibration activation signal by combining the period calibration signal and a reset signal.

14. The semiconductor integrated circuit according to claim 13, wherein the period calibrator comprises:
   a flip flop configured to receive the refresh signal through an input terminal; and
   a transmitting device configured to transmit the address signal to an enable input terminal of the flip flop in response to activation of the refresh signal.

15. The semiconductor integrated circuit according to claim 14, wherein the signal generator is configured to perform an OR logical operation on the period calibration signal and the reset signal.

16. The semiconductor integrated circuit according to claim 15, is wherein the impedance calibration activation signal generator further comprises a pulse width calibrator configured to adjust the pulse width of the refresh signal, wherein the adjusted pulse width is input to the period calibrator.

17. The semiconductor integrated circuit according to claim 9, wherein the impedance calibration code generator comprises:
   a comparator configured to compare a reference voltage to a code conversion voltage to output a comparing signal;
   a counter configured to perform an up/down count of the impedance calibration code according to the comparing signal; and
   a digital/analog converter configured to convert the impedance calibration code into the code conversion voltage.

18. The semiconductor integrated circuit according to claim 11, wherein the input and output circuit unit comprises:
   a receiver configured to compare a signal input through an input and output pad with a reference voltage and output a write data;
   a driver configured to drive a read data by an impedance set according to the impedance calibration code and output the read data to the input and output pad; and
   an on die termination block configured to perform a termination operation for the input and output pad by the impedance set according the impedance calibration code.

19. An impedance calibration setting circuit comprising:
   a command decoder configured to generate a refresh signal;
   an impedance calibration activation signal generator configured to generate an impedance calibration activation signal for controlling the impedance of input and output data in response to the refresh signal and an address signal,
   the impedance calibration activation signal having an activation period that varies according to which one of a plurality of bits of the address signal is selected and input to the impedance calibration activation signal generator such that the activation period is adjustable according to the address signal.

20. The impedance calibration period setting circuit according to claim 19, wherein the impedance calibration activation signal generator comprises:
   a period calibrator configured to output a period calibration signal by latching the refresh signal in response to activation of the address signal, wherein the address signal is input in response to activation of the refresh signal; and
   a signal generator configured to generate the impedance calibration activation signal by combining the period calibration signal and a reset signal.

* * * * *